United States Patent
Zhong

(10) Patent No.: US 11,943,953 B2
(45) Date of Patent: Mar. 26, 2024

(54) ORGANIC LIGHT EMITTING DIODE AND FABRICATING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Anxing Zhong, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 889 days.

(21) Appl. No.: 16/966,009

(22) PCT Filed: Jan. 14, 2020

(86) PCT No.: PCT/CN2020/071894
§ 371 (c)(1),
(2) Date: Jul. 30, 2020

(87) PCT Pub. No.: WO2021/134831
PCT Pub. Date: Jul. 8, 2021

(65) Prior Publication Data
US 2023/0180508 A1    Jun. 8, 2023

(30) Foreign Application Priority Data
Dec. 31, 2019 (CN) .......................... 201911409910.4

(51) Int. Cl.
*H10K 50/844* (2023.01)
*H10K 71/00* (2023.01)

(52) U.S. Cl.
CPC .......... *H10K 50/844* (2023.02); *H10K 71/00* (2023.02)

(58) Field of Classification Search
None
See application file for complete search history.

(56) References Cited

U.S. PATENT DOCUMENTS

2007/0215864 A1* 9/2007 Luebben ............. H10K 85/141
528/4
2014/0225091 A1* 8/2014 O'Carroll ............ H10K 30/00
257/40

FOREIGN PATENT DOCUMENTS

WO WO-2014007867 A1 * 1/2014 ............. B82Y 10/00

* cited by examiner

*Primary Examiner* — Michael Lebentritt
(74) *Attorney, Agent, or Firm* — PV IP PC; Wei Te Chung; Zhigang Ma

(57) ABSTRACT

An organic light emitting diode and a fabricating method thereof are provided, where a package is performed on a surface of a light emitting layer. The process is simple, and it can effectively protect the light emitting layer, prevent water and oxygen from invading and reducing activity of a light emitting layer material, and effectively improve the service life of the organic light emitting diode. Problems of poor packaging effect and complicated preparation procedures of the organic light emitting device in the prior art are solved.

17 Claims, 3 Drawing Sheets

ORGANIC LIGHT EMITTING DIODE AND FABRICATING METHOD THEREOF

FIELD OF DISCLOSURE

The present disclosure relates to displays, and more particularly to an organic light emitting diode and a fabricating method thereof.

BACKGROUND OF DISCLOSURE

An organic light emitting diode (OLED) is an emerging flat-panel display technology. The OLED display technology is different from traditional LCD display methods. It does not require a backlight and uses a very thin coating of organic materials and a glass substrate layer, where these organic materials emit light when electric current pass through it. Because of its simple preparation process, low cost, low power consumption, high luminous brightness, wide range of operating temperature adaptability, light weight, fast response speed, easy to implement color display and large screen display, easy to match with integrated circuit drivers, easy to realize advantages of flexible display and so on, it has broad application prospects.

Under an action of an external electric field, an OLED light-emitting device injects electrons and holes from a cathode and an anode to an organic functional layer sandwiched between the electrodes, respectively. The injected electrons and holes migrate from an electron transport layer and a hole transport layer to the light emitting layer, respectively. After the electrons and holes are injected into the light emitting layer, they are bound together to form an electron-hole pair, that is, an exciton. Due to the imbalance in the transport of electrons and holes, a main formation region of the exciton usually does not cover the entire light emitting layer, and therefore diffusion migration occurs due to the concentration gradient. Eventually, a photon is excited by decay of exciton radiation, and the photon is emitted mainly through the exciton radiation transition. In order to prevent carriers from being trapped and inactivated by traps during the process of forming excitons, reducing number of excitons and reducing luminous efficiency, an effective packaging method is necessary.

SUMMARY OF DISCLOSURE

An object of the present disclosure is to provide an organic light emitting diode and a fabricating method thereof, so as to solve problems of poor packaging effect of the OLED light emitting device and complicated fabricating procedures in the prior art.

To achieve above objects, the present disclosure provides a fabricating method of an organic light emitting diode, comprising following steps of: providing a substrate layer; forming a first electrode layer on the substrate layer; forming a blended active layer on a surface of the first electrode layer facing away from the substrate layer, wherein the blended active layer comprises a light emitting layer and a first packaging layer, and the first packaging layer covers a surface of the light emitting layer; and forming a second electrode layer on a surface of the first packaging layer facing away from the first electrode layer.

Further, the step of forming the blended active layer on the surface of the first electrode layer facing away from the substrate layer comprises: mixing a polymer material into the light emitting material to form a blended active solution, and coating the blended active solution on the first electrode layer to form the blended active layer, wherein the polymer material is uniformly dispersed on the surface of the light emitting layer.

Further, the blended active solution is formed on the surface of the first electrode layer facing away from the substrate layer in a roll-to-roll manner.

Further, the fabricating method of the organic light emitting diode further comprises following step of: forming a second packaging layer on a surface of the second electrode layer facing away from the light emitting layer, wherein the second electrode layer is a cathode layer.

The present disclosure further provides an organic light emitting diode comprising: a substrate layer; a first electrode layer; a blended active layer; and a second electrode layer.

The first electrode layer is disposed on the substrate layer. The blended active layer is disposed on a surface of the first electrode layer facing away from the substrate layer. The first electrode layer is disposed on a surface of the blended active layer facing away from the first electrode layer. The second electrode layer is disposed on a surface of the blended active layer facing away from the first electrode layer.

Wherein, the blended active layer comprises a light emitting layer and a first packaging layer, and the first packaging layer covers a surface of the light emitting layer.

Further, material of the blended active layer comprises a light emitting material and a polymer material.

Further, material of the first packaging layer comprises a polymer material.

Further, the organic light emitting diode further comprises a second packaging layer disposed on a surface of the second electrode layer facing away from the blended active layer.

Further, the first electrode layer is an anode layer, and the second electrode layer is a cathode layer.

The present disclosure further provides a display device comprising the organic light emitting diode as described above.

Advantages of the disclosure are that:

The fabricating method of an organic light emitting diode in the present disclosure has a simple preparation process and low preparation cost, and can improve the packaging ability of the organic light emitting diode without adding a new process.

An organic light emitting diode and a fabricating method thereof in the present disclosure are provided, where a package is performed on a surface of a light emitting layer. The process is simple, and it can effectively protect the light emitting layer. It can effectively protect the light emitting layer, prevent water and oxygen from invading and reducing activity of a light emitting layer material, and effectively improve the service life of the organic light emitting diode. Simultaneously, it will not affect a luminous efficiency of the organic light emitting diode and a carrier transmission.

Figure 1:
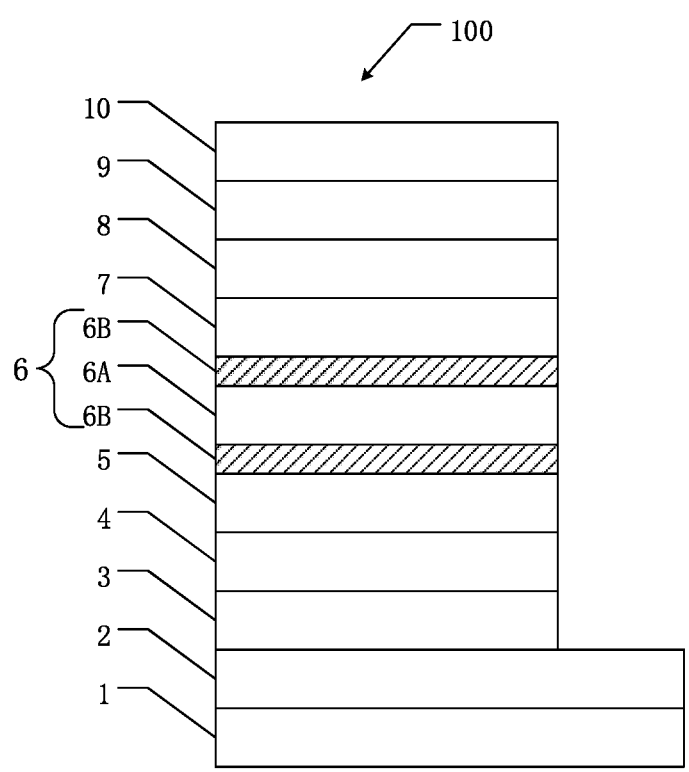
FIG. 1 is a schematic diagram of a layered structure of an organic light emitting diode in Embodiment 1 of the present disclosure.

Components in figures are represented as follows:
organic light emitting diode 100;
substrate layer 1; first electrode layer 2;
hole injection layer 3; hole transport layer 4;
electron blocking layer 5; blended active layer 6;
light emitting layer 6A; first packaging layer 6B;
hole blocking layer 7; electron transport layer 8;
electron injection layer 9; second electrode layer 10;
second packaging layer 11.

DETAILED DESCRIPTION OF PREFERRED EMBODIMENTS

Preferred embodiments of the present disclosure are described in the following with reference to accompanying drawings, which demonstrate that the present disclosure can be implemented, and the embodiments of the present disclosure can be fully described for those skilled in the art to make the technical content clearer and easier to understand. The present disclosure may be embodied in many different forms of embodiments, and scope of the present disclosure is not limited to the embodiments disclosed herein.

In the drawings, structurally identical components are denoted by same reference numerals, and structural or functionally similar components are denoted by like reference numerals. Dimensions and thickness of each component shown in the drawings are arbitrarily shown, and the disclosure does not limit the size and thickness of each component. In order to make the illustration clearer, some parts of the drawing appropriately exaggerate the thickness of the parts.

In addition, the description of each of the following embodiments of the disclosure is provided to illustrate specific embodiments of the disclosure in which the disclosure may be practiced. The directional terms mentioned in the present disclosure, for example, "upper", "lower", "front", "back", "left", "right", "inside", "outside", "side", etc., are merely directions referring to the adding drawings. Therefore, the directional terminology used is for the purpose of illustration and understanding of the disclosure, rather than indicating or implying that the device or component referred to has a particular orientation, construction, and operation in a particular orientation. Therefore, it is not to be construed as limiting the disclosure. Moreover, the terms "first", "second", "third", and the like are used for descriptive purposes only and are not to be construed as indicating or implying relative importance.

When some components are described as "on" another component, the components may be placed directly on the another component; or may also be an intermediate component in which the component is placed on the intermediate component, and the intermediate component is placed on the another component. When a component is described as "mounted to" or "connected to" another component, both of them may be understood to be "mounted" or "connected" directly, or a component is "mounted to" or "connected" to another component through an intermediate component.

Embodiment 1

An embodiment of the present disclosure discloses an organic light emitting diode 100. As shown in FIG. 1, the organic light emitting diode 100 includes a substrate layer 1, a first electrode layer 2, a hole injection layer 3, a hole transport layer 4, an electron blocking layer 5, a blended active layer 6, a hole blocking layer 7, an electron transport layer 8, an electron injection layer 9, and a second electrode layer 10.

Material of the substrate layer 1 is polyimide (PI), which is a flexible substrate layer 1 and which protects a structure of the organic light emitting diode 100 while promoting the organic light emitting diode 100 to achieve flexible display.

The first electrode layer 2 is disposed on the substrate layer 1. Material of the first electrode layer 2 is indium tin oxide (ITO), which is used to provide a current and voltage for the organic light emitting diode 100 to promote holes to migrate to the light emitting layer 6A. The first electrode layer 2 is an anode layer.

The hole injection layer 3 is disposed on a surface of the first electrode layer 2 facing away from the substrate layer 1, which is used to reduce a potential barrier for injecting holes from the first electrode layer 2, so that the holes can be efficiently injected into the light emitting layer 6A.

The hole transport layer 4 is disposed on a surface of the hole injection layer 3 facing away from the first electrode layer 2 and is used to transport holes in the hole-injection layer 3 into the light emitting layer 6A.

The electron blocking layer 5 is disposed on a surface of the hole transport layer 4 facing away from the hole injection layer 3 and is used to prevent electrons in the light emitting layer 6A from entering the hole injection layer 3.

The blended active layer 6 includes a light emitting layer 6A and a first packaging layer 6B.

The light emitting layer 6A is disposed on a surface of the electron blocking layer 5 facing away from the hole transport layer 4, and material of the light blocking layer 6A includes a light emitting material. The holes and the electrons are condensed and combined in the light emitting layer 6A under a driving of the electric field and voltage of the first electrode layer 2 and the second electrode layer 10, thereby converting electric energy into light energy, and realizing electroluminescence.

The first packaging layer 6B covers a surface of the light emitting layer 6A. A light transmittance of the first packaging layer 6B is greater than or equal to 50%. Material used for fabricating the first packaging layer 6B is a polymer material with high light transmittance, such as polyacrylonitrile, for protecting the light emitting layer 6A, blocking water and oxygen, and avoiding inactivation of carriers by traps during exciton formation.

The hole blocking layer 7 is disposed on a surface of the blended active layer 6 facing away from the electron blocking layer 5 and is used to prevent holes in the light emitting layer 6A from entering the electron injection layer 9.

The electron transporting layer 8 is disposed on a surface of the hole blocking layer 7 facing away from the blended active layer 6 and is used to transport electrons in the electron injection layer 9 into the light emitting layer 6A.

The electron injection layer 9 is disposed on a surface of the electron transport layer 8 facing away from the hole blocking layer 7 and is used to reduce barrier of electron injection from the second electrode layer 10, so that the electrons can be efficiently injected into the light emitting layer 6A.

The second electrode layer 10 is disposed on a surface of the electron injection layer 9 facing away from the electron transport layer 8. The second electrode layer 10 is used to provide a current and voltage to the electron injection layer 9 to promote electron movement toward the light emitting layer 6A. The second electrode layer 10 is a cathode layer.

Driven by the voltage of the first electron layer 2 and the second electrode layer 10, the injected holes and electrons migrate from the hole transport layer 4 and the electron transport layer 8 to the light emitting layer 6A, respectively. And in the light emitting layer 6A, they are bound together by the Coulomb force to form an electron-hole pair, that is, an exciton, thereby exciting chemical molecules in the light-emitting layer 6A to produce light and realize self-luminescence.

Figure 2:
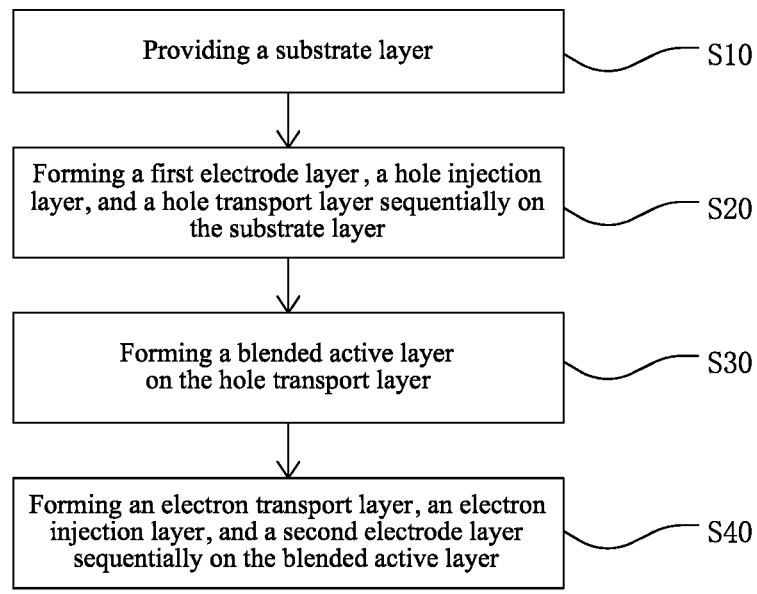
FIG. 2 is a schematic flowchart of a fabricating method of an organic light emitting diode in Embodiment 1 of the present disclosure.

An embodiment of the present disclosure further discloses a fabricating method of an organic light emitting diode 100. The fabricating process is shown in FIG. 2. The specific fabricating steps include:

In step S10, a substrate layer 1 is provided.

A substrate layer 1 is provided. The substrate layer 1 is a flexible substrate layer 1 and material thereof is polyimide.

In step S20, a first electrode layer 2, a hole injection layer 3, and a hole transport layer 4 are sequentially formed on the substrate layer 1.

A layer of indium tin oxide material is formed on the substrate layer 1 by plating processes such as sputtering and evaporation to form the first electrode layer 2. A hole injection material and a hole transport material are sequentially plated on a surface of the first electrode layer 2 facing away from the substrate layer 1 by a process such as evaporation to form the hole injection layer 3 and the hole transport layer 4.

In step S30, a blended active layer 6 is formed on the hole transport layer 4.

Polymer material polyacrylonitrile is incorporated into the light emitting material to form a blended active solution, and the blended active solution is coated on the hole transport layer 4 in a roll-to-roll manner, and the blended active layer 6 is formed after drying. The blended active layer 6 includes a light emitting layer 6A and a first packaging layer 6B covering the surface of the light emitting layer 6A. The polymer materials in the blended active solution are uniformly dispersed in the surface of the light emitting layer 6A to form the first packaging layer 6B.

In step S40, An electron transport layer 8, an electron injection layer 9, and a second electrode layer 10 are sequentially formed on the blended active layer 6.

Through processes such as evaporation, an electron transport material, an electron injection material, and a second electrode layer material are sequentially plated on the surface of the blended active layer 6 facing away from the first electrode layer 2, so as to form the electron transport layer 8, the electron injection layer 9, and the second electrode layer 10. Material of the second electrode layer 10 is a conductive metal.

An embodiment of the present disclosure further provides a display device, which includes the organic light emitting diode 100 fabricated by the fabricating method described above. The display device may be any product or component having a display function, such as a mobile phone, a tablet computer, and a notebook computer.

An organic light emitting diode 100 is provided in this embodiment, and a surface of the light emitting layer 6A is covered with a first packaging layer 6B for protecting the light emitting layer 6A and preventing the light emitting layer 6A from being corroded by water and oxygen to affect an activity of the material of the light emitting layer 6A, thereby improving a service life of the organic light emitting diode 100. In addition, the first packaging layer 6B has high light transmittance, and its light transmittance is identical to or greater than 50%, and does not block light emitted from the light emitting layer 6A. Simultaneously, material of the first packaging layer 6B has a certain carrier transmission capability, and does not affect the carrier transmission.

The fabricating method of an organic light emitting diode 100 provided in the present embodiment has a simple manufacturing process and can achieve packaging effects without adding a packaging process or a packaging device, thereby saving resources and costs.

Embodiment 2

Figure 3:
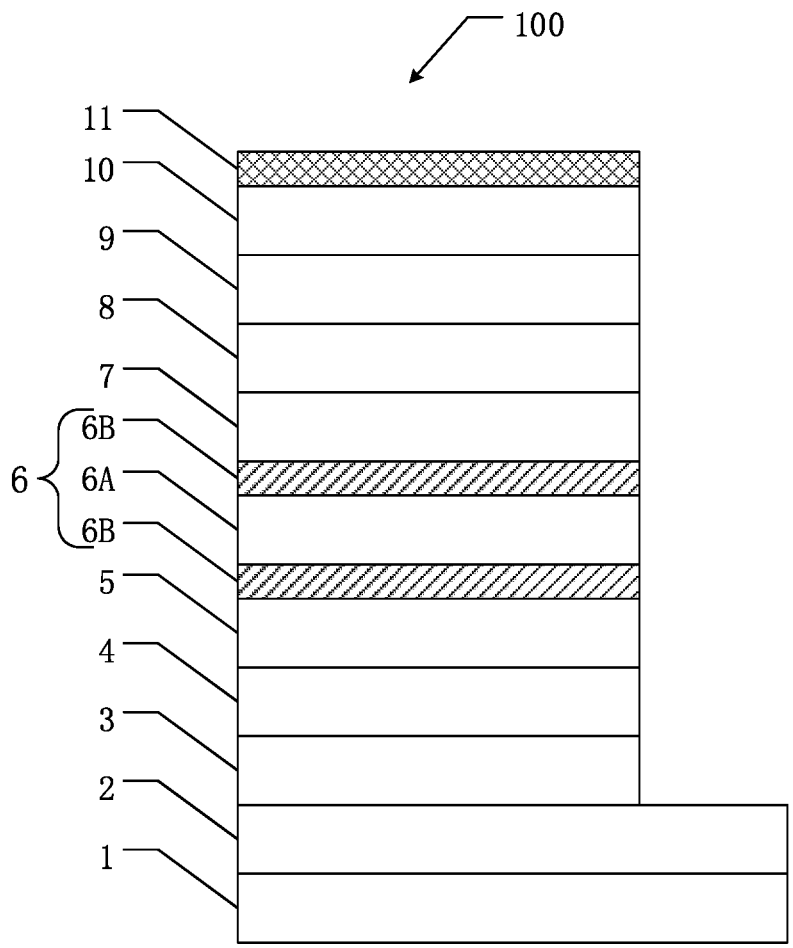
FIG. 3 is a schematic diagram of a layered structure of an organic light emitting diode in Embodiment 2 of the present disclosure.

An embodiment of the present disclosure discloses an organic light emitting diode 100. As shown in FIG. 3, the organic light emitting diode 100 includes a substrate layer 1, a first electrode layer 2, a hole injection layer 3, a hole transport layer 4, an electron blocking layer 5, a blended active layer 6, a hole blocking layer 7, an electron transport layer 8, an electron injection layer 9, a second electrode layer 10, and a second packaging layer.

Material of the substrate layer 1 is polyimide (PI), which is a flexible substrate layer 1 and which protects a structure of the organic light emitting diode 100 while promoting the organic light emitting diode 100 to achieve flexible display.

The first electrode layer 2 is disposed on the substrate layer 1. Material of the first electrode layer 2 is indium tin oxide (ITO), which is used to provide a current and voltage for the organic light emitting diode 100 to promote holes to migrate to the light emitting layer 6A. The first electrode layer 2 is an anode layer.

The hole injection layer 3 is disposed on a surface of the first electrode layer 2 facing away from the substrate layer 1, which is used to reduce a potential barrier for injecting holes from the first electrode layer 2, so that the holes can be efficiently injected into the light emitting layer 6A.

The hole transport layer 4 is disposed on a surface of the hole injection layer 3 facing away from the first electrode layer 2 and is used to transport holes in the hole-injection layer 3 into the light emitting layer 6A.

The electron blocking layer 5 is disposed on a surface of the hole transport layer 4 facing away from the hole injection layer 3 and is used to prevent electrons in the light emitting layer 6A from entering the hole injection layer 3.

The blended active layer 6 includes a light emitting layer 6A and a first packaging layer 6B.

The light emitting layer 6A is disposed on a surface of the electron blocking layer 5 facing away from the hole transport layer 4, and material of the light blocking layer 6A includes a light emitting material. The holes and the electrons are condensed and combined in the light emitting layer 6A under a driving of the electric field and voltage of the first electrode layer 2 and the second electrode layer 10, thereby converting electric energy into light energy, and realizing electroluminescence.

The first packaging layer 6B covers a surface of the light emitting layer 6A. A light transmittance of the first packaging layer 6B is greater than or equal to 50%. Material used for fabricating the first packaging layer 6B is a polymer material with high light transmittance, such as polyacrylonitrile, for protecting the light emitting layer 6A, blocking water and oxygen, and avoiding inactivation of carriers by traps during exciton formation.

The hole blocking layer 7 is disposed on a surface of the blended active layer 6 facing away from the electron blocking layer 5 and is used to prevent holes in the light emitting layer 6A from entering the electron injection layer 9.

The electron transporting layer 8 is disposed on a surface of the hole blocking layer 7 facing away from the blended active layer 6 and is used to transport electrons in the electron injection layer 9 into the light emitting layer 6A.

The electron injection layer 9 is disposed on a surface of the electron transport layer 8 facing away from the hole blocking layer 7 and is used to reduce barrier of electron injection from the second electrode layer 10, so that the electrons can be efficiently injected into the light emitting layer 6A.

The second electrode layer 10 is disposed on a surface of the electron injection layer 9 facing away from the electron transport layer 8. The second electrode layer 10 is used to provide a current and voltage to the electron injection layer 9 to promote electron movement toward the light emitting layer 6A.

Driven by the voltage of the first electron layer 2 and the second electrode layer 10, the injected holes and electrons migrate from the hole transport layer 4 and the electron transport layer 8 to the light emitting layer 6A, respectively. And in the light emitting layer 6A, they are bound together by the Coulomb force to form an electron-hole pair, that is, an exciton, thereby exciting chemical molecules in the light-emitting layer 6A to produce light and realize self-luminescence.

The second packaging layer 11 is disposed on a surface of the second electrode layer 10 facing away from the electron injection layer 9. Material of the second packaging layer 11 is an organic adhesive, which is used to isolate water and oxygen, protect the organic light emitting diode 100 from corrosion, and improve a service life of the organic light emitting diode 100.

Figure 4:
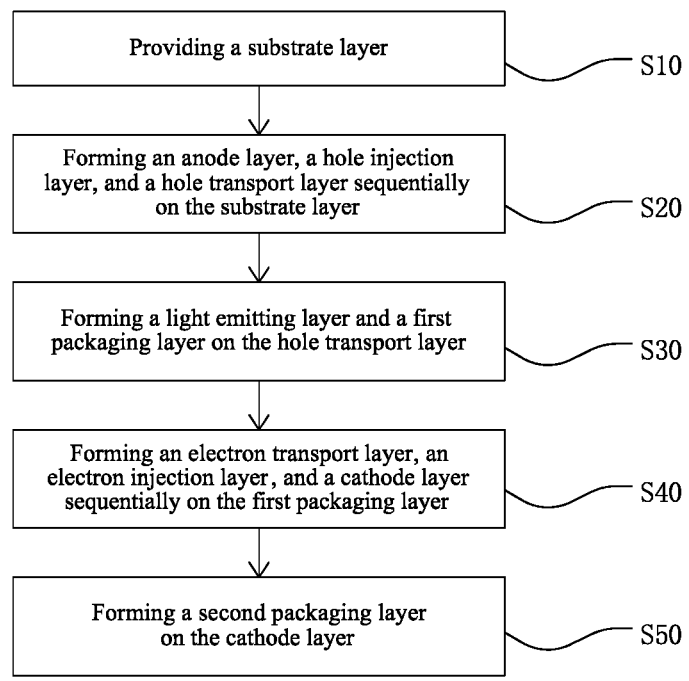
FIG. 4 is a schematic flowchart of a fabricating method of an organic light emitting diode in Embodiment 2 of the present disclosure.

An embodiment of the present disclosure further discloses a fabricating method of an organic light emitting diode 100. The fabricating process is shown in FIG. 4. The specific fabricating steps include:

In step S10, a substrate layer 1 is provided.

A substrate layer 1 is provided. The substrate layer 1 is a flexible substrate layer 1 and material thereof is polyimide.

In step S20, a first electrode layer 2, a hole injection layer 3, and a hole transport layer 4 are sequentially formed on the substrate layer 1.

A layer of indium tin oxide material is formed on the substrate layer 1 by plating processes such as sputtering and evaporation to form the first electrode layer 2. A hole injection material and a hole transport material are sequentially plated on a surface of the first electrode layer 2 facing away from the substrate layer 1 by a process such as evaporation to form the hole injection layer 3 and the hole transport layer 4.

In step S30, a blended active layer 6 is formed on the hole transport layer 4.

Polymer material polyacrylonitrile is incorporated into the light emitting material to form a blended active solution, and the blended active solution is coated on the hole transport layer 4 in a roll-to-roll manner, and the blended active layer 6 is formed after drying. The blended active layer 6 includes a light emitting layer 6A and a first packaging layer 6B covering the surface of the light emitting layer 6A. The polymer materials in the blended active solution are uniformly dispersed in the surface of the light emitting layer 6A to form the first packaging layer 6B.

In step S40, An electron transport layer 8, an electron injection layer 9, and a second electrode layer 10 are sequentially formed on the blended active layer 6.

Through processes such as evaporation, an electron transport material, an electron injection material, and a second electrode layer material are sequentially plated on the surface of the blended active layer 6 facing away from the first electrode layer 2, so as to form the electron transport layer 8, the electron injection layer 9, and the second electrode layer 10. Material of the second electrode layer 10 is a conductive metal.

In step S50, a second packaging layer 11 is formed on the second electrode layer 10.

An organic adhesive is coated on a surface of the second electrode layer 10 facing away from the blended active layer 6, and the organic adhesive is cured to form the second packaging layer 11.

An embodiment of the present disclosure further provides a display device, which includes the organic light emitting diode 100 fabricated by the fabricating method described above. The display device may be any product or component having a display function, such as a mobile phone, a tablet computer, and a notebook computer.

An organic light emitting diode 100 provided in this embodiment adopts a double-layer package. A surface of the light-emitting layer 6A is covered with a first packaging layer 6B. Simultaneously, a second packaging layer 11 is disposed on the second electrode layer 10. The double-layer package can further prevent the light emitting layer 6A from being corroded by water and oxygen to affect an activity of the material of the light emitting layer 6A, and further prevent other devices in the organic light emitting diode 100 from being corroded. The organic light emitting diode 100 is protected to the maximum extent, and a service life of the organic light emitting diode 100 is improved. The first packaging layer 6B has high light transmittance, and its light transmittance is identical to or greater than 50%, and it will not block light emitted from the light emitting layer 6A. Simultaneously, material of the first packaging layer 6B has a certain carrier transmission capability, and does not affect the carrier transmission.

The fabricating method of the organic light emitting diode 100 provided in this embodiment has a simple manufacturing process, and can achieve better packaging effects without adding new processes, saving resources and costs.

Although the disclosure is described herein with reference to specific embodiments, it should be understood that these embodiments are merely examples of the principles and applications of the disclosure. It should therefore be understood that many modifications can be made to the exemplary embodiments and that other arrangements can be devised without departing from the spirit and scope of the disclosure as defined by the appended claims. It should be understood that different dependent claims and features described herein may be combined in a manner different from that described in the original claims. It can also be understood that features described in connection with separate embodiments may be used in other described embodiments.

The invention claimed is:

1. A fabricating method of an organic light emitting diode, comprising following steps of:
    providing a substrate layer;
    forming a first electrode layer on the substrate layer;
    forming a blended active layer on a surface of the first electrode layer facing away from the substrate layer, wherein the blended active layer comprises a light emitting layer and a first packaging layer, and the first packaging layer covers a surface of the light emitting layer; and
    forming a second electrode layer on a surface of the first packaging layer facing away from the first electrode layer.

2. The fabricating method according to claim 1, wherein the step of forming the blended active layer on the surface of the first electrode layer facing away from the substrate layer comprises: mixing a polymer material into the light emitting material to form a blended active solution, and coating the blended active solution on the first electrode layer to form the blended active layer, wherein the polymer material is uniformly dispersed on the surface of the light emitting layer.

3. The fabricating method according to claim 2, wherein the blended active solution is formed on the surface of the first electrode layer facing away from the substrate layer in a roll-to-roll manner.

4. The fabricating method according to claim 1, further comprising following step of:
 forming a second packaging layer on a surface of the second electrode layer facing away from the light emitting layer,
 wherein the second electrode layer is a cathode layer.

5. An organic light emitting diode, comprising:
 a substrate layer;
 a first electrode layer disposed on the substrate layer;
 a blended active layer disposed on a surface of the first electrode layer facing away from the substrate layer; and
 a second electrode layer disposed on a surface of the blended active layer facing away from the first electrode layer,
 wherein the blended active layer comprises a light emitting layer and a first packaging layer, and the first packaging layer covers a surface of the light emitting layer.

6. The organic light emitting diode according to claim 5, wherein material of the blended active layer comprises a light emitting material and a polymer material.

7. The organic light emitting diode according to claim 6, wherein material of the first packaging layer comprises a polymer material.

8. The organic light emitting diode according to claim 5, further comprising:
 a second packaging layer disposed on a surface of the second electrode layer facing away from the blended active layer.

9. The organic light emitting diode according to claim 5, wherein the first electrode layer is an anode layer, and the second electrode layer is a cathode layer.

10. A display device comprising a organic light emitting diode, wherein the organic light emitting diode comprises
 a substrate layer;
 a first electrode layer disposed on the substrate layer;
 a blended active layer disposed on a surface of the first electrode layer facing away from the substrate layer; and
 a second electrode layer disposed on a surface of the blended active layer facing away from the first electrode layer,
 wherein the blended active layer comprises a light emitting layer and a first packaging layer, and the first packaging layer covers a surface of the light emitting layer.

11. The display device according to claim 10, wherein material of the blended active layer comprises a light emitting material and a polymer material.

12. The display device according to claim 11, wherein material of the first packaging layer comprises a polymer material.

13. The display device according to claim 12, wherein the material of the first packaging layer comprises polyacrylonitrile.

14. The display device according to claim 10, further comprising:
 a second packaging layer disposed on a surface of the second electrode layer facing away from the blended active layer.

15. The display device according to claim 10, wherein the first electrode layer is an anode layer, and the second electrode layer is a cathode layer.

16. The fabricating method according to claim 1, wherein material of the first packaging layer comprises polyacrylonitrile.

17. The organic light emitting diode according to claim 7, wherein the material of the first packaging layer comprises polyacrylonitrile.

* * * * *